United States Patent
Heinz

(10) Patent No.: US 6,552,472 B1
(45) Date of Patent: Apr. 22, 2003

(54) PIEZOELECTRIC ACTUATOR

(75) Inventor: Rudolf Heinz, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/601,726

(22) PCT Filed: Nov. 5, 1999

(86) PCT No.: PCT/DE99/03531

§ 371 (c)(1),
(2), (4) Date: Aug. 25, 2000

(87) PCT Pub. No.: WO00/34700

PCT Pub. Date: Jun. 15, 2000

(30) Foreign Application Priority Data

Dec. 5, 1998 (DE) ............ 198 56 186

(51) Int. Cl.$^7$ ................................. H02N 2/00
(52) U.S. Cl. ........................ 310/328; 310/340
(58) Field of Search ................. 310/328, 340

(56) References Cited

U.S. PATENT DOCUMENTS

| | | | |
|---|---|---|---|
| 3,598,506 A | * 8/1971 | O'Neill | 417/383 |
| 4,011,474 A | * 3/1977 | O'Neill | 310/328 |
| 4,553,059 A | * 11/1985 | Abe et al. | 310/328 |
| 4,803,393 A | * 2/1989 | Takahashi | 310/328 |
| 5,168,189 A | * 12/1992 | Dam et al. | 310/328 |
| 5,218,259 A | * 6/1993 | Dam et al. | 310/328 |
| 5,239,223 A | * 8/1993 | Miyoshi | 310/328 |
| 5,271,133 A | * 12/1993 | Dam et al. | 29/25.35 |
| 6,172,445 B1 | * 1/2001 | Heinz et al. | 310/328 |

FOREIGN PATENT DOCUMENTS

| | | | |
|---|---|---|---|
| DE | 199 09 451 | * | 9/2000 |
| JP | 03-033356 | * | 9/1992 |
| JP | 2000-022228 | * | 1/2000 |
| JP | 2000-134958 | * | 5/2000 |
| WO | 97/15630 | * | 5/1997 |

* cited by examiner

Primary Examiner—Tran Nguyen
Assistant Examiner—Jaydi Aguirrechea
(74) Attorney, Agent, or Firm—Ronald E. Greigg

(57) ABSTRACT

The invention relates to a piezoelectric actuator, in particular for actuating control valves or injection valves in internal combustion engines in motor vehicles, having a piezoelectric actuator body, in particular in the form of a multilayer laminate of layered plies of piezoelectric material and intervening metal or electrically conductive layers acting as electrodes, in which one of the face ends of the actuator body is fixed on an actuator base, and the actuator body is surrounded by a module wall so as to define an interstice there between, and the interstice is filled with an elastic or plastic electrically insulating material of good thermal conductivity, which is solid at least in the temperature range below the operating temperature of the actuator.

17 Claims, 1 Drawing Sheet

PIEZOELECTRIC ACTUATOR

PRIOR ART

BACKGROUND OF THE INVENTION

The invention is directed to improvements in a piezoelectric actuator, in particular for actuating control valves or injection valves in internal combustion engines in motor vehicles, having a piezoelectric actuator body, in particular in the form of a multilayer laminate of layered plies of piezoelectric material and intervening metal or electrically conductive layers acting as electrodes, these electrode layers being contacted by electrically conductive common electrode leads, and one of the face ends of the actuator body is fixed on an actuator base, and the actuator body is surrounded by a module wall while maintaining an interstice between them.

One such piezoelectric actuator is disclosed in German Patent Disclosure DE 196 50 900 A1 of Robert Bosch GmbH.

As is well known, piezoelectric actuators can for instance be used for injection valves of a vehicle motor and in brake systems with anti-lock and traction control systems.

Such injection valves equipped with piezoelectric actuators have an injection nozzle controlled by a tappetlike closure device. An operative face toward the nozzle is disposed on the tappet and is acted upon by the pressure of the fuel supplied to the nozzle; the pressure forces seek to urge the tappet in the opening direction of the closure device. The tappet protrudes with a plungerlike end, whose cross section is larger than the aforementioned operative face, into a control chamber. The pressure effective there seeks to urge the tappet in the closing direction of the closure device. The control chamber communicates with the fuel supply, which is at a high pressure, via an inlet throttle and with a fuel return line that has only low pressure, via an outlet valve that is throttled as a rule or is combined with an outlet throttle. When the outlet valve is closed, a high pressure prevails in the control chamber, by which the tappet is moved in the closing direction of the closure device, counter to the pressure on its operative face toward the nozzle, or is kept in the closing position. Upon opening of the outlet valve, the pressure in the control chamber drops; the magnitude of the drop in pressure is determined by the size of the inlet throttle and by the throttle resistance of the opened outlet valve, or the outlet throttle combined with it. As a result, the pressure in the control chamber decreases when the outlet valve is opened, in such a way that the tappet is moved in the opening direction of the closure device, or held in the open position, by the pressure forces that are operative on its operative face toward the nozzle.

In comparison with electromagnetically actuated injection valves, piezoelectric actuators can switch faster. However, in the design of a piezoelectric actuator, it must be noted that internal losses in the piezoelectric body of the actuator cause lost heat, which has to be dissipated so that the actuator will not overheat. Since the ceramic materials of the piezoelectric ceramic have poor heat conductivity, the dissipation inside the actuator body, which substantially comprises ceramic material, is unfavorable.

The heat generated by the actuator backs up in the interstice between the actuator body and the module wall, if only air is present in the interstice.

Cooling the actuator with a liquid coolant, such as fuel, water, motor oil and the like, which is theoretically possible, is unfavorable, first because of the risk of a short circuit from the water component that is contained both in the fuel and in motor oil, and second because the actuator module is more expensive because of complicated seals, to preclude leakage of the coolant used, especially when the actuator becomes heated.

OBJECT OF THE INVENTION

It is therefore the object of the invention to make a generic piezoelectric actuator possible in such a way that cooling during operation is possible without a liquid coolant such as motor oil, water or fuel; that the piezoelectric actuator can be installed simply, and that no special seals as in liquid cooling are necessary.

SUMMARY OF THE INVENTION

A piezoelectric actuator according to the invention thus has the advantage that the heated actuator body can be cooled without fuel, motor oil or water, that is, without the risk of causing a short circuit because of the water component, and also without the risk of leakage.

According to the invention, to that end the interstice between the actuator body and the module wall is filled with an elastic or plastic electrically insulating material with good heat conductivity, which at least in the temperature range below the operating temperature of the actuator is solid. With this kind of material as a cooling medium, the risk of leakage disappears.

Cooling from thermal conduction through the interstice, filled with the electrically insulating solid, radially directly into the module wall, which for instance is of metal, enhances the cooling effect in comparison with thermal conduction exclusively to the actuator base.

Advantageously, gas or air bubbles are admixed with the material; they prevent a major pressure development in the interior of the actuator module.

The viscosity of the material used as the cooling medium can be selected either in such a way that it does change to a fluid liquid state even when heated, or alternatively in such a way that the material, such as a wax, changes to the liquid state at higher temperatures, which can be in the range between 50° C. and 100° C. The formation of the liquid phase of the material at elevated temperature intensifies the cooling, and the cooling remains sufficiently strong.

At room temperature and below, the actuator exhibits a somewhat shorter stroke. The phase of the shorter stroke is quickly completed as a result of faster heating.

In the solid state of the material, the cooling is only moderate; that is, by intrinsic heating, the actuator changes very quickly over to the operating state having the greater stroke, before the cooling then ensues by liquefication of the material.

Care is preferably taken to assure that the interstice of the piezoelectric actuator of the invention is not completely filled with material, so that when the actuator heats up, this material can expand into a chamber that contains air or gas.

So that no hindrance of the actuator stroke will ensue, the module wall, which for instance is of metal, is coated on the inside with an anti-stick coating, which prevents the material from adhering to the wall.

The surface of the actuator body can also be provided with an anti-stick coating of this kind, for instance of PTFE.

Also preferably, the actuator base is sealed off from the interstice that contains the material by a sealing agent, such as an adhesive, so that the liquefied material cannot escape from the actuator module.

Further characteristics and advantages of the invention will become clear below from the description of the ensuing exemplary embodiments of the invention taken in conjunction with the drawing.

DESCRIPTION OF THE PREFERRED EMBODIMENTS

Figure 1:
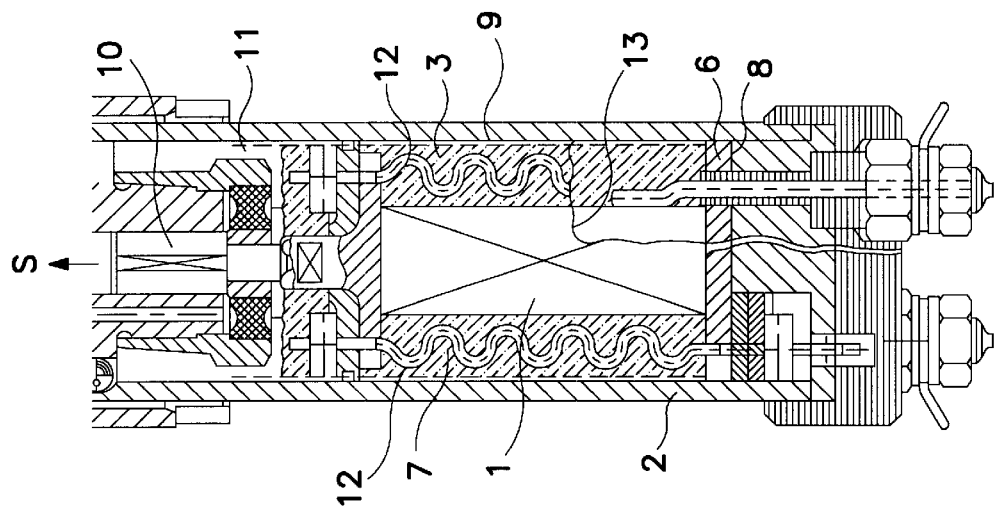
FIG. 1 shows a schematic longitudinal section view of a first embodiment of the invention, with the section changing in the area of cut line 13, which is placed as it is to depict the electrical connection on the right hand side, and show the connection means for the spring on the left side.

In the first exemplary embodiment, shown in fragmentary longitudinal section in FIG. 1, of a piezoelectric actuator of the invention, an actuator body 1, which can take the form of a multilayer laminate of stacked layers of piezoelectric material and metal or electrically conductive layers between them and acting as electrodes, with its lower face end fixed on an actuator base 6 and surrounded by a module wall 2 with an interstice 7 being maintained. A spring band 12 on the left and on the right elastically prestresses the actuator body 1 between the actuator base 6 and an upper ring flange (not identified by reference numeral).

If the actuator body 1 is acted upon at its electrodes with a pulsating electrical voltage, it executes analogously pulsating strokes, changing the spacing between its face ends fastened between the upper ring flange and the actuator base 6 by the spring bands 12. These strokes are transmitted to the needle (not shown) of a valve (see action arrow S) via a piston 10. It should also be noted that the electrode supply leads extend toward the bottom to lead clamps not identified by reference numeral.

In the embodiment of FIG. 1, the interstice 7 between the actuator body 1 and the metal module wall 2 is filled with a low-viscosity elastomer 3, or some other elastic solid, which is electrically insulating. Furthermore, as indicated in FIG. 1, heat-conducting particles 4 are admixed with the elastic solid 3.

The solid 3 is elastic and has low viscosity, so as not to hinder the strokes of the actuator core. To accommodate the different thermal expansion of the solid 3 compared to the other components, gas or air bubbles 5 are also added to the solid, so that high pressures will not occur when the actuator heats up. The gas or air bubbles can also be united in collected form in a larger volume.

In the embodiment shown in FIG. 1, the nature of the solid 3, that is, the elastomer, is selected such that over the entire operating temperature range of the actuator, it does not yet change to a fluid liquid state. As a result, no special effort is needed for sealing off the actuator base 6.

In FIG. 1, it should also be noted that the solid 3, optionally together with the heat-conducting particles 4 and the air bubbles 5, also fills the space above the upper ring flange, that is, the space 11 around the piston 10, since this space is not closed off from the lower part of the interstice 7.

Figure 2:
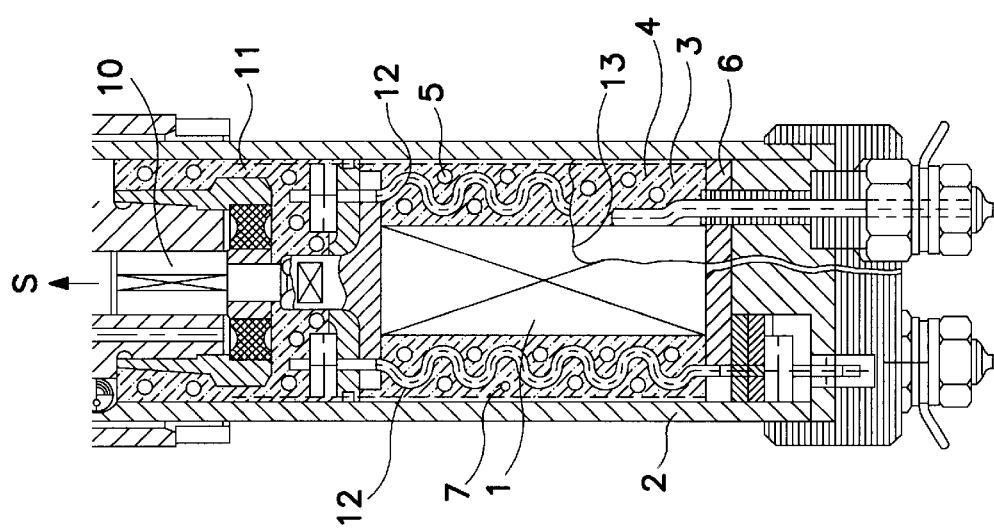
FIG. 2 shows a schematic longitudinal section view of a second embodiment of a piezoelectric actuator of the invention, with the section changing in the area of cut line 13, which is placed as it is to depict the electrical connection on the right hand side, and show the connection means for the spring on the left side.

The embodiment shown in FIG. 2 of the piezoelectric actuator of the invention improves the cooling still further by providing that the interstice 7 is filled with a material 3, such as a wax, which changes over to the liquid state at elevated temperatures, for instance in the range from 50° C. to 100° C. Thus rapid heating of the actuator to operating temperature and after that intensive cooling are attained because of the liquid state of the material 3 acting as a heat conduction medium. Upon disassembly, there are no refilling problems, since in the cooled state the material 3 is in the solid state. Compared with the elastic heat-conducting solid 3 of FIG. 1, the material 3 acting as the heat-conducting medium in the embodiment shown in FIG. 2 is more plastic in nature, if a wax is selected to serve that purpose.

In the upper part, that is, the space 11 surrounding the piston 10, an air or gas filling is provided in FIG. 2, which in turn serves to absorb expansion upon thermal expansion of the material 3.

To prevent the material in the solid state from hindering actuator expansion, the wall 2 of the actuator module is provided on the inside with an anti-stick coating 9, which prevents the material 3 from adhering to the inner wall. This anti-stick coating can for instance be of PTFE, such as Teflon™. The surface of the actuator body 1 can also be provided with such an anti-stick coating.

The advantage is that at low temperatures (down to 40° C.), the coolant medium 3 separates from the wall because of shrinkage, and the heat conductivity is thus worsened still further, causing the actuator 1 to reach its operating temperature faster. This characteristics also applies to FIG. 1, with the filling of elastomer 3 and anti-stick coating on the inner wall of 2.

It should also be noted that in the embodiment of the piezoelectric actuator shown in FIG. 2, the bottom plate 6, because of the liquid phase of the coolant 3, is sealed off by a sealing means 8, such as adhesive.

Thus in the exemplary embodiment shown in FIG. 2, the formation of a liquid phase of the solid 3 intensifies the cooling at elevated temperature, especially at operating temperature. At room temperature and below, the actuator body 1 can have a shorter stroke. In the solid state of the material 3, the cooling action by thermal conduction of the material 3 is reduced; that is, the actuator body 1 very rapidly changes by intrinsic heating into its operating state with a longer stroke, before the cooling then ensues by liquefication of the material 3.

The anti-stick coating of the module wall 2 and optionally of the wall of the actuator body 1 as well prevents any possible stroke reduction of the actuator from the material 3.

The foregoing relates to a preferred exemplary embodiments of the invention, it being understood that other variants and embodiments thereof are possible within the spirit and scope of the invention, the latter being defined by the appended claims.

I claim:

1. A piezoelectric actuator, for actuating control valves or injection valves in internal combustion engines in motor vehicles, having a piezoelectric actuator body (1) formed of a multilayer laminate of layered plies of piezoelectric material and intervening electrically conductive layers acting as electrodes, the actuator body (1) has a face end fixed on an actuator base (6), and the actuator body (1) is surrounded by a module wall (2) defining an interstice therebetween (7), wherein the interstice (7) is filled with an electrically insulating material (3) having good thermal conductivity, which insulating material is solid at least in a temperature range below an operating temperature of the actuator and above −50° C., and wherein said electrically insulating material is a plastic like material, in which the solid material (3) is filled with heat-conducting filler (4), and in which gas or air bubbles (5) are admixed with the solid material (3).

2. The piezoelectric actuator of claim 1, in which said electrically conducting layers are metal.

3. The piezoelectric actuator of claim 1, in which said electrically insulting material is elastic.

4. The piezoelectric actuator of claim 1, in which a viscosity of the material (3) is selected such that even upon heating the material does not change over to a fluid liquid state.

5. The piezoelectric actuator of claim 1, in which the heat-conducting material (3), is selected to change over to the liquid state at elevated temperatures.

6. A piezoelectric actuator, for actuating control valves or injection valves in internal combustion engines in motor vehicles, having a piezoelectric actuator body (1) formed of a multilayer laminate of layered plies of piezoelectric material and intervening electrically conductive layers acting as electrodes, the actuator body (1) has a face end fixed on an actuator base (6), and the actuator body (1) is surrounded by a module wall (2) defining an interstice therebetween (7),
wherein the interstice (7) is filled with an electrically insulating material (3) having good thermal conductivity, which material is solid at least in a temperature range below an operating temperature of the actuator, and wherein the material (3) that fills the interstice (7) is a solid comprising a low-viscosity elastomer.

7. The piezoelectric actuator of claim 6, in which that the solid material (3) is filled with heat-conducting filler (4).

8. The piezoelectric actuator of claim 6, in which gas or air bubbles (5) are admixed with the solid material (3).

9. A piezoelectric actuator, for actuating control valves or injection valves in internal combustion engines in motor vehicles, having a piezoelectric actuator body (1) formed of a multilayer laminate of layered plies of piezoelectric material and intervening electrically conductive layers acting as electrodes, the actuator body (1) has a face end fixed on an actuator base (6), and the actuator body (1) is surrounded by a module wall (2) defining an interstice therebetween (7),
wherein the interstice (7) is filled with an electrically insulating material (3) having good thermal conductivity, which material is solid at least in a temperature range below an operating temperature of the actuator, and in which gas or air bubbles (5) are admixed with the solid material (3).

10. A piezoelectric actuator, for actuating control valves or injection valves in internal combustion engines in motor vehicles, having a piezoelectric actuator body (1) formed of a multilayer laminate of layered plies of piezoelectric material and intervening electrically conductive layers acting as electrodes, the actuator body (1) has a face end fixed on an actuator base (6), and the actuator body (1) is surrounded by a module wall (2) defining an interstice therebetween (7), wherein the interstice (7) is filled with an electrically insulating material (3) having good thermal conductivity, which material is solid at least in a temperature range below an operating temperature of the actuator, and material (3) is selected to change over to the liquid state at elevated temperatures, and wherein the interstice (7) is not completely filled by the material (3), so that the material on heating up can expand into a space (11) that contains air or gas.

11. The piezoelectric actuator of claim 10, in which a liquefaction temperature of the material (3) is selected to be between 50° C. and 100° C.

12. The piezoelectric actuator of claim 10, in which the material (3) is a wax.

13. The piezoelectric actuator of claim 10, in which the module wall (2) is coated on an inside thereof with an anti-stick coating (9), which coating prevents the material (3) from adhering to the wall.

14. The piezoelectric actuator of claim 13, in which the anti-stick coating (9) comprises PTFE.

15. The piezoelectric actuator of claim, 10, in which an external surface of the actuator body (1) is provided with an anti-stick coating (9).

16. The piezoelectric actuator of claim 10, in which the actuator base (6) is sealed off from the interstice (7) containing the material (3) by a sealing means.

17. The piezoelectric actuator of claim 16, in which the sealing means is an adhesive.

\* \* \* \* \*